United States Patent [19]
Aoki et al.

[11] Patent Number: 6,153,921
[45] Date of Patent: *Nov. 28, 2000

[54] DIODE DEVICE

[75] Inventors: Yutaka Aoki; Takashi Ishikawa; Haruhiko Taguchi; Takeshi Kasahara, all of Tsurugashima, Japan

[73] Assignee: Toko Kabushiki Kaisha, Tokyo-to, Japan

[*] Notice: This patent is subject to a terminal disclaimer.

[21] Appl. No.: 09/434,283

[22] Filed: Nov. 5, 1999

[30] Foreign Application Priority Data

Nov. 5, 1998 [JP] Japan ................................. 10-314365

[51] Int. Cl.[7] .................................................. H01L 31/075
[52] U.S. Cl. .......................................... 257/656; 257/778
[58] Field of Search .................................... 257/584, 587, 257/656, 481, 603–606, 777, 778

[56] References Cited

U.S. PATENT DOCUMENTS

| | | | |
|---|---|---|---|
| 3,821,779 | 6/1974 | Usuda | 257/666 |
| 4,250,520 | 2/1981 | Denlinger | 257/778 |
| 4,608,589 | 8/1986 | Goth et al. | 257/516 |
| 4,860,083 | 8/1989 | Kojo | 257/516 |
| 4,999,683 | 3/1991 | Kiyomura et al. | 257/606 |
| 5,181,083 | 1/1993 | Pezzani | 257/656 |
| 5,475,257 | 12/1995 | Hashimoto et al. | 257/587 |
| 6,008,527 | 12/1999 | Kasahara | 257/656 |

*Primary Examiner*—David Hardy
*Attorney, Agent, or Firm*—Pillsbury Madison & Sutro LLP

[57] ABSTRACT

Disclosed is a diode device in which two electrodes of regions forming both terminals are provided on the same face, thereby enabling the device to be connected to a circuit substrate by face-down bonding. Since a region is located within the semiconductor base, an electrode cannot be connected at the top face thereof; to overcome this, a groove is provided extending in a perpendicular direction from the top face of the semiconductor base to the region, and an electrode is provided in the groove. Then, the electrode in the groove is exposed at the top face, enabling the electrodes of both regions to be connected at the top face.

5 Claims, 2 Drawing Sheets

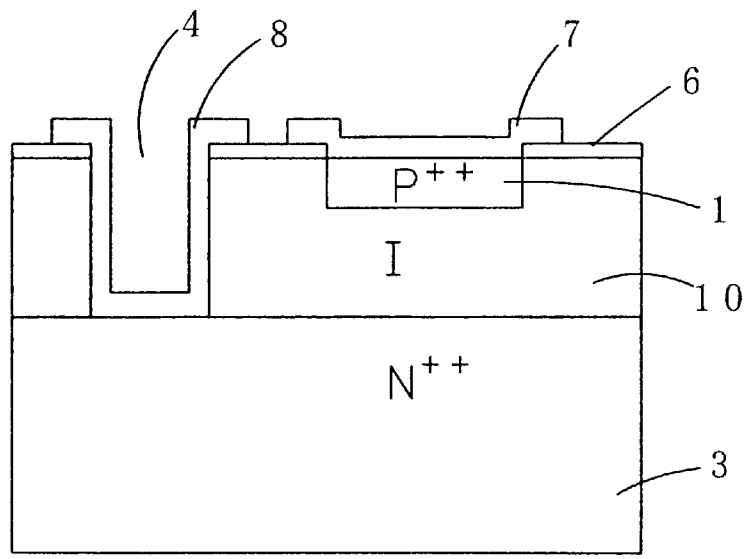
F I G. 3
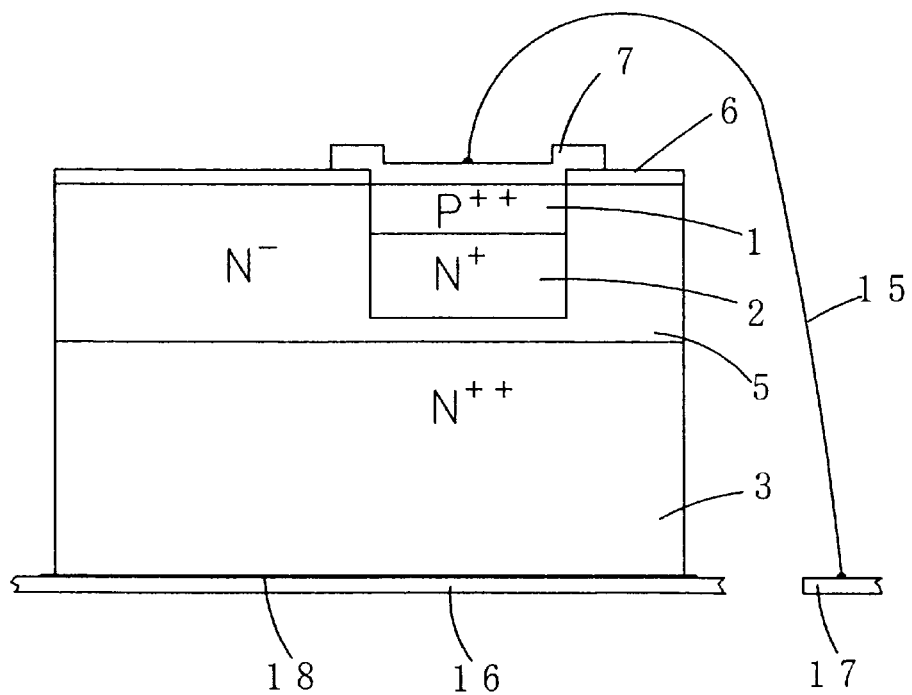
F I G. 4

DIODE DEVICE

BACKGROUND OF THE INVENTION

1. Field of the Invention

The present invention relates to a diode device in which both electrodes of two terminals are provide on the same surface, and can be directly connected to a conductive pattern of a circuit substrate without using a lead wire.

2. Description of the Related Art

Face-down bonding is a method for directly attaching integrated circuits to circuit boards such as printed boards and the like without using lead wires, conventionally used in the construction of various types of electronic circuits.

According to this method, electrodes are provided on the same surface of the integrated circuit,which is then turned face down and bonded directly to the circuit board. Since the integrated circuit consequently requires no packaging, the size of the integrated circuit can be scaled-down, lowering costs. For these reasons, face-down bonding is generally used.

However, although this method can be used for integrated circuits, chiefly being provided transistors in it, in which electrodes can be disposed on the same surface, it has not been possible to use face-down bonding in the case of diode devices having only two electrodes, such as, for instance, variable-capacity diodes.

FIG. 4 is a cross-sectional view illustrating a conventional variable-capacity diode device, in which region 1 and region 2, having different conductive types, are provided within an epitaxial layer 5 on a silicon semiconductor substrate 3, thereby forming a PN junction such as super abrupt junction.

A first region 1 is exposed at the top face of a semiconductor base, comprising a substrate 3 and an epitaxial layer 5, and therefore an electrode 7 can be provided on the top face thereof. However, since a second region 2 is provided below the first region 1, an electrode 18 of the second region 2 is provided on the bottom face of the substrate 3.

The electrode 18 on the bottom face is attached to a terminal 16. A ribbon-like metal is inserted between the substrate 3 and the terminal 16 at the attach portion and heated, forming a eutectic of the terminal 16, the metal, and the substrate 3.

A metal lead wire 15 connects the electrode 7 on the top face to a terminal 17. Then, with only the terminals 16 and 17 exposed to the outside, a packaging of resin sealant or the like is applied, and the terminals 16 and 17 are connected to a circuit substrate.

Thus it has not been possible to connect the conventional diode device to a circuit board by means of face-down bonding since the two electrodes cannot be provided on the same surface.

The present applicant disclosed an invention to improve the defects of conventional diode devices in Japanese Patent Application Laid-Open No. 9-79112.

However, this technique is not satisfied from an economic view point because it requires a diffusion process.

SUMMARY OF THE INVENTION

It is an object of the present invention to provide an inexpensive diode device wherein two electrodes of regions forming both terminals are provided on the same surface, enabling the diode device to be connected to a circuit substrate using face-down bonding.

In order to achieve the above object the diode device of the present invention comprises: a first region forming a terminal exposed at a top face of a semiconductor base; an electrode provided in the first region; a second region forming another terminal within the semiconductor base, or exposed at a face opposite to said top face; and a groove extending from the top face, where said first region forming a terminal is provided, through the semiconductor base to the second region forming the other terminal, an electrode of the second region forming the other terminal being provided in said groove.

BRIEF DESCRIPTION OF THE DRAWINGS

FIG. 3 is a cross-sectional view of another embodiment of the diode device of the present invention; and FIG. 4 is a cross-sectional view illustrating a conventional diode device.

DESCRIPTION OF THE PREFERRED EMBODIMENTS

A region inside a semiconductor base cannot be connected to its electrode at the top face of the semiconductor base. To overcome this, a groove is provided extending in a perpendicular direction from the top face of the base to the region, and the electrode for the region is provided in the groove.

Then, the electrodes of both regions forming the terminals can be connected at the top face by exposing the electrode in the groove at the top face, making face-down bonding possible.

Figure 1:
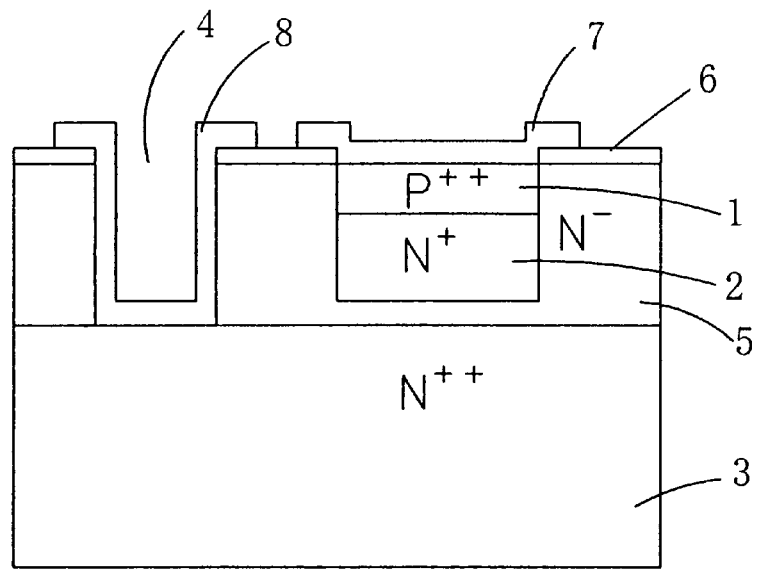
FIG. 1 is a cross-sectional view of an embodiment of the diode device of the present invention.
Figure 2:
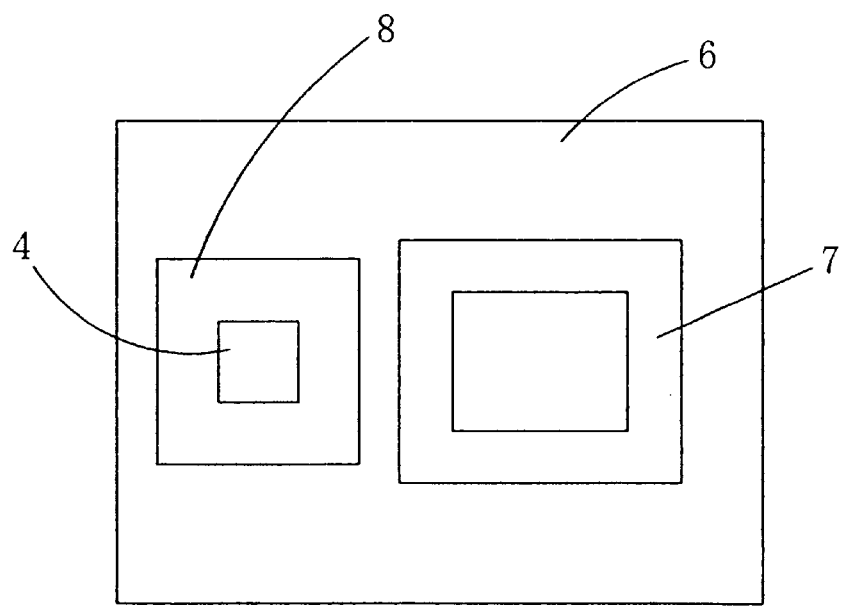
FIG. 2 is a plan view of FIG. 1.

Next, an embodiment of the diode device of the present invention will be explained with reference to FIGS. 1 and 2, using a variable-capacitance diode device as an example. FIG. 1 is a cross-sectional view, and FIG. 2 is a plan view, elements which are the same as those shown in FIG. 4 being represented by the same reference numerals.

In FIG. 1, numeral 3 represent an n-type silicon semiconductor substrate of low specific resistance. An epitaxial layer 5 of high specific resistance has the same conductive type as the substrate 3, and is provided thereon. A p-type first region 1 of low specific resistance is exposed at the top face of the epitaxial layer 5, and an n-type second region 2 of low specific resistance is provided below the first region 1. The first region 1 and the second region 2 form a pn junction, and constitute two terminals of the variable-capacitance diode device.

Furthermore, a groove 4 is provided in the epitaxial layer 5 near to the regions 1 and 2, and extends in a perpendicular direction from the top face of the epitaxial layer 5 to the substrate 3. A second electrode 8 is provided in the groove 4 so as to cover the bottom and side faces thereof while being exposed at the top face.

The electrode 8 is connected via the substrate 3 and the epitaxial layer 5 to the region 2, and forms the electrode of the region 2. A first electrode 7 connects to the region 1. If required, bumps may be provided at the top races of the electrode 7 and the electrode 8.

In this type of variable-capacitance diode device, the electrode 7, which is the anode, connects directly to the region 1, and the electrode 8, which is the cathode, connects to the region 2 via the substrate 3, which acts as a third region, and the very thin epitaxial layer 5.

The electrodes 7 and 8 are both provided on the same face of the epitaxial layer 5 of the semiconductor base, making face-down bonding possible.

The groove 4 can be formed using an ordinary silicon etching fluid comprising hydrogen fluoride doped with nitric acid. Even with a comparatively thick epitaxial layer 5 having a thickness of approximately 10 μm, the process can be completed in less than ten minutes.

By contrast, more than ten hours may be required to provide a diffusion layer of low specific resistance in an epitaxial layer 5 having the same thickness.

The process of forming the groove 4 can be set freely during manufacture, but it should preferably be set before the regions 1 and 2 are provided once the epitaxial layer 5 has been formed.

FIG. 3 is a cross-sectional view of another embodiment of the diode device of the present invention and shows a PIN diode device.

An epitaxial layer 10 comprising a substantially intrinsic semiconductor (represented by I) having an extremely high specific resistance is provided on a semi conductor substrate 3. A first region 1 is provided in the epitaxial layer 10, and is exposed at the top face thereof.

Therefore, the epitaxial layer 10 comprising a substantially intrinsic semiconductor, constituting a fourth region, is provided between the n-type substrate 3 and the region 1, creating a junction between the substrate 3 and the epitaxial layer 10, and a junction between the region 1 and the epitaxial layer 10. This obtains a PIN diode device having the region 1 and the substrate 3 as its two terminals.

A groove 4 is provided in the epitaxial layer 10, and extends in a perpendicular direction from the top face thereof to the semiconductor substrate 3. A second electrode 8 is provided in the groove 4, and is exposed at the top face thereof. The electrode 8 connects directly to the substrate 3, which acts as a third region. Thus, the cathode and anode electrodes are also both provided on the same face of the semiconductor base in this PIN diode device.

In the present embodiment, the substrate 3, which acts as a third region, forms an NI junction and functions as one terminal of the diode.

In the first embodiment, the substrate 3 is not a region forming the pn junction and acting as one of the diode terminals, but only has the function of connecting the region 2, which is one terminal of the diode, to the electrode 8.

The third region 3 may be used to form a junction of the diode in this way, or it may function merely as a conductor, without forming part of the diode. Furthermore, although the substrate 3 acts as the third region here, an additional buried layer can be provided and used as the third region.

In the present embodiment, one groove 4 is provided near the region 1, which forms the diode junction and is exposed at the top face. However, multiple grooves can be provided, for instance in a circular shape around the region 1.

Instead of a chemical method, the grooves may be provided by a physical method such as using a laser beam or gas etching.

Furthermore, although the present embodiment describes a variable-capacitance diode device and a PIN diode device, it is clear that the invention can be widely applied to various types of diode devices.

As described above, in the diode device of the present invention, a groove extends into a semiconductor base from the top face thereof, and an electrode of a region forming one terminal, which is not exposed at the top face of the semiconductor base, is provided in the groove. Therefore, the two electrodes of the regions forming both terminals of the diode device can be provided on the same face, and can be connected to a circuit substrate without using lead wires.

By using an etching fluid, the groove can be provided in a short time even in a comparatively thick epitaxial layer. Consequently, the diode device can be efficiently manufactured without complicating the manufacturing process.

Furthermore, since the groove can be provided without heating process such as diffusion, it is not necessary to clean the furnace to remove significant dirt which becomes attached thereto after lengthy periods of heating.

Furthermore, the characteristics of the diode device do not deteriorate as a result of unwanted diffusion during the heating process.

Thus, the diode device of the present invention can be connected to the circuit substrate in the same way as an integrated circuit comprising transistors, and is extremely practical as regards miniturization and costs.

What is claimed is:

1. A diode device comprising: a first region forming a terminal exposed at a top face of a semiconductor base; an electrode provided in the first region; a second region forming another terminal within the semiconductor base, or exposed at a face opposite to said top face; and a groove extending from the top face, where said first region firming a terminal is provided, through the semiconductor base to the second region forming the other terminal, an electrode of the second region forming the other terminal being provided in said groove.

2. A diode device comprising: a first region of one conductive type, provided in a semiconductor base and exposed at a top face thereof; a second region of an opposite conductive type to said first region, the second region being provided below said first region and forming a junction therewith; third region of the same conductive type as said second region and provided therebelow; a groove extending in a perpendicular direction from the top face of said base to said third region; an electrode connected to said first region provided at the top face of said base; and an electrode connected to said second region provided in said groove.

3. The diode device according to claim 2, wherein said first region, said second region, and said groove are provided in an epitaxial layer, and said third region comprises a semiconductor substrate.

4. A diode device comprising: a first region of a first conductive type, provided in a semiconductor base and exposed at a top face thereof; a third region of an opposite conductive type to said first region and provided therebelow; a fourth region comprising a substantially intrinsic semiconductor, provided between said first region and said third region and forming junctions respectively therewith; a groove extending in a perpendicular direction from the top face of said base to said third region; an electrode connected to said first region provided at the top face of said base; and an electrode connected to said third region provided in said groove.

5. The diode device according to claim 4, wherein said fourth region comprises an epitaxial layer, said first region and said groove are provided within said epitaxial layer, and said third region comprises a semiconductor substrate.

* * * * *